United States Patent
Okumura et al.

[11] Patent Number: 6,010,950
[45] Date of Patent: Jan. 4, 2000

[54] METHOD OF MANUFACTURING SEMICONDUCTOR BONDED SUBSTRATE

[75] Inventors: Hideki Okumura, Yokohama; Akihiko Osawa, Tokyo; Yoshiro Baba, Yokohama, all of Japan

[73] Assignee: Kabushiki Kaisha Toshiba, Kawasaki, Japan

[21] Appl. No.: 09/026,508

[22] Filed: Feb. 19, 1998

[30] Foreign Application Priority Data

Feb. 28, 1997 [JP] Japan .................................. 9-045491

[51] Int. Cl.[7] ........................................ H01L 21/30
[52] U.S. Cl. .................. 438/455; 438/406; 438/459; 438/481
[58] Field of Search .................... 438/406, 455, 438/459, 977, FOR 107, FOR 485, FOR 222, 481; 148/DIG. 12

[56] References Cited

U.S. PATENT DOCUMENTS 5,273,616  12/1993  Bozler et al. .
5,443,661  8/1995   Oguro et al. .
5,906,626  6/1999   Kobayashi .

OTHER PUBLICATIONS

Easter, W.G., et al., "Polysilicon t oSilicon Bonding in Laminated Dielectrically Isolated (LDI) Wafers", Extended Abstracts of the Electrochemical Society, vol. 91–2, pp. 707–710, Oct. 1991.

*Primary Examiner*—George Fourson
*Attorney, Agent, or Firm*—Finnegan, Henderson, Farabow, Garrett & Dunner, L.L.P.

[57] ABSTRACT

The most distinctive feature of the present invention lies in that a warp and crystal defects can be prevented from occurring and a processing margin for forming an isolation groove can be improved in an intelligent power device including a power element section and an IC control section within one chip. A bonded wafer is obtained by bonding an active-layer substrate and a supporting substrate with an epitaxially grown silicon layer interposed therebetween so as to cover an oxide film selectively formed at the interface of the active-layer substrate. Isolation trenches are then formed in the bonded wafer to such a depth as to reach the oxide film from the element forming surface of the active-layer substrate. Thus, an IC controller is formed within a dielectric isolation region surrounded with the isolation trenches and the oxide film and accordingly the IC controller can effectively be isolated by a dielectric.

1 Claim, 3 Drawing Sheets

METHOD OF MANUFACTURING SEMICONDUCTOR BONDED SUBSTRATE

BACKGROUND OF THE INVENTION

The present invention relates to a semiconductor device and a semiconductor bonded substrate used for manufacturing the same and, more particularly, to a semiconductor bonded substrate for use in an IPD (Intelligent Power Device) including a power element section and an IC control section for controlling the power element section both of which are mounted within one chip.

As one conventional method of isolating a power element section and an IC control section of an IPD, junction isolation using P and N layers of high impurity concentration is known. Since, however, it is difficult to completely isolate these sections from each other, the junction isolation is not suitable for the IPD in which the power element section requires a high withstanding voltage.

As another method of element isolation, V-shaped trench isolation using a bonded SOI (Silicon on Insulator) wafer is known. The bonded SOI wafer is obtained by bonding the mirror-finished surface of one silicon wafer to that of another silicon wafer on which an oxide film is formed, and a V-shaped trench is formed in the element forming surface of the SOI wafer to such a depth as to reach the oxide film, with the result that the elements are isolated from each other.

In the V-shaped trench isolation, however, the area of the trench occupied on the element forming surface is so large that a chip is increased in area. There is a physical limit to application of the V-shaped trench to the IPD.

In contrast, trench isolation using a bonded SOI wafer has recently been used widely in the IPD.

FIG. 1 illustrates the constitution of a prior art IPD adopting trench isolation using a bonded SOI wafer.

In the IPD, a bonded SOI wafer 104 is obtained by bonding the mirror-finished surface of a supporting substrate 103 constituted of silicon to that of an active-layer substrate 101 constituted of different silicon on which an oxide film 102 is formed, and an isolation trench 105 is formed in the element forming surface of the wafer 104 to such a depth as to reach the oxide film 102.

An IC control section 108 including a CMOS circuit 107 is formed within an element region (dielectric isolation region) 106 completely surrounded with the isolation trench 105 and oxide film 102, and a power element section 111 including a bipolar transistor 110 is formed within another element region 109.

According to the IPD having the above constitution, both a problem wherein the elements cannot be completely isolated when the power element requires a high withstanding voltage in the junction isolation and a problem wherein the area of the chip is increased in the V-shaped trench isolation.

However, the foregoing prior art PID has the following problems.

The active-layer substrate 101 is formed to thickness of about 15 μm in order to heighten the withstanding voltage and, in this case, the bonded SOI wafer 104 is warped greatly. This warp is suppressed by forming an oxide film 121 of about 1 μm in thickness on the non-element forming surface of the wafer 104.

To form the bonded SOI wafer 104, the substrate 101 of 620 μm in thickness is bonded to the substrate 103 and then polished to thickness of 15 μm, thereby forming an element forming surface. For this reason, crystal defects are easy to occur on the element forming surface of the substrate 101, and an element will be formed where the crystal defects occur.

Furthermore, a technique of forming a deep trench in the active-layer substrate 101 of 15 μm in thickness is required in order to form the isolation trench 105, and a processing margin for forming the trench is low.

As described above, the active-layer substrate has to be increased in thickness on its element forming surface, in order to heighten a withstanding voltage. An oxide film is required to prevent the bonded SOI wafer from being warped. Crystal defects are easy to occur on the element forming surface of the active-layer substrate, and a processing margin for forming the isolation trench is low. Since, moreover, the source and drain electrodes (or emitter and collector electrodes) for switching are formed on the same major surface, it is difficult to reduce the area of a chip and improve in current density.

BRIEF SUMMARY OF THE INVENTION

It is accordingly an object of the invention to provide a semiconductor device and a semiconductor bonded substrate used for manufacturing the same, in which an active-layer substrate can be formed as thin as possible, a warp and crystal defects can be prevented from occurring, and a processing margin for forming an isolation groove can be improved.

In order to attain the above object, according to one aspect of the present invention, there is provided a semiconductor bonded substrate comprising:

an active-layer substrate on which an element is to be formed;

a dielectric layer selectively provided on one major surface of the active-layer substrate;

an epitaxial layer formed on the major surface of the active-layer substrate so as to cover the dielectric layer; and a supporting substrate bonded to the major surface of the active-layer substrate with the epitaxial layer interposed therebetween.

According to another aspect of the present invention, there is provided a method of manufacturing a semiconductor bonded substrate, comprising the steps of:

selectively forming a dielectric layer on one major surface of an active-layer substrate;

forming an epitaxial layer on the major surface of the active-layer substrate in thickness covering the dielectric layer;

mirror-finishing a surface of the epitaxial layer; and bonding a mirror-finished supporting substrate to the mirror-finished surface of the epitaxial layer.

According to still another embodiment of the present invention, there is provided a semiconductor device comprising:

an active-layer substrate on which an element is to be formed;

a dielectric layer selectively provided on one major surface of the active-layer substrate;

an epitaxial layer formed on the major surface of the active-layer substrate so as to cover the dielectric layer;

a supporting substrate bonded to the major surface of the active-layer substrate with the epitaxial layer interposed therebetween;

a plurality of isolation grooves formed to such a depth as to reach the dielectric layer from other surface of the active-layer substrate on which the element is to be formed;

at least one logic element surrounded with the isolation grooves and the dielectric layer and formed within a first isolation region on the active-layer substrate; and at least one power element isolated by the isolation grooves and formed within a second isolation region other than the first isolation region on the active-layer substrate.

In the semiconductor device and the semiconductor bonded substrate having the above constitution, only the region for forming a logic element is isolated by a dielectric. Thus, the active-layer substrate can be thinned sufficiently.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 2:
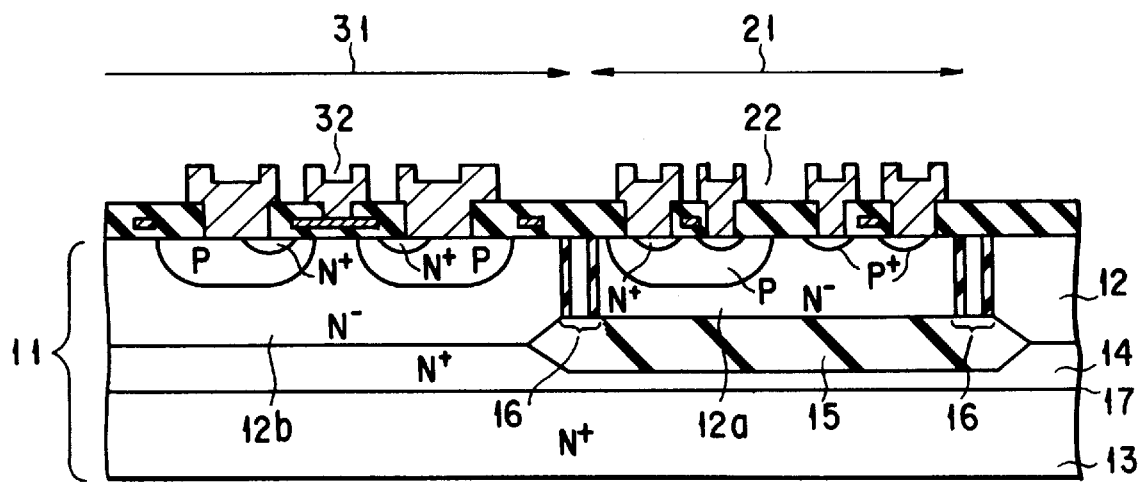
FIG. 2 is a cross-sectional view illustrating the principal part of an IPD according to a first embodiment of the present invention.

FIG. 2 illustrates the principal part of an IPD according to a first embodiment of the present invention.

A bonded wafer (semiconductor bonded substrate) 11 used in the IPD includes an active-layer substrate 12 of an N-type silicon wafer, a supporting substrate 13 of an N$^+$-type silicon wafer bonded to the active-layer substrate 12 with an N$^+$-type silicon layer (epitaxial layer) 14 interposed therebetween, and an oxide film (dielectric layer) 15 selectively formed at the interface between the active-layer substrate 12 and silicon layer 14.

Isolation trenches (isolation grooves) 16 are formed in the active-layer substrate 12 to such a depth as to reach the oxide film 15 from the element forming surface of the active-layer substrate 12. An IC controller 21 constituted of at least one logic element is formed within a dielectric isolation region (first isolation region) 12a completely surrounded with the isolation trenches 16 and oxide film 15. In this case, for example, a CMOS circuit 22 including N- and P-channel MOS transistors is formed as the above logic element. Polysilicon is buried into the isolation trenches 16 with a sidewall insulation film therebetween.

On the other hand, a power element section 31 having at least one power element and controlled by the IC controller 21, is formed within an element region (second isolation region) 12b joined to the silicon layer 14. In this case, a vertical type power MOSFET (D MOS) 32, which causes current to flow in the vertical direction of the bonded wafer 11, is formed as the above power element.

In the IPD having the foregoing constitution, the first isolation region 12a constituting the IC controller 21 is completely isolated from the second isolation region 12b by both the oxide film 15 and isolation trenches 16 to protect the IC controller 21 from a depletion layer extending from the base of the power element section 31. Consequently, the IC controller 21 of the IPD can effectively be isolated by a dielectric and thus the active-layer substrate 12 can be thinned more greatly than the conventional one.

In other words, the active-layer substrate 12 has only to have a thickness of about 5 µm which is capable of forming a logic section. The substrate 12 can thus be prevented from being warped and, unlike the conventional device, any measures against the warp such as formation of the oxide film, are not needed. Further, an element can be formed on the layer free of crystal defects. Since, furthermore, a deep trench need not be formed, a processing margin for forming a trench can be improved.

If the bonded wafer 11 having the foregoing constitution is employed in the IPD, electrons and holes are generated and recombined at an interface 17 between the supporting substrate 13 and silicon layer 14, and thus high-speed switching of the device can be achieved.

Figure 1:
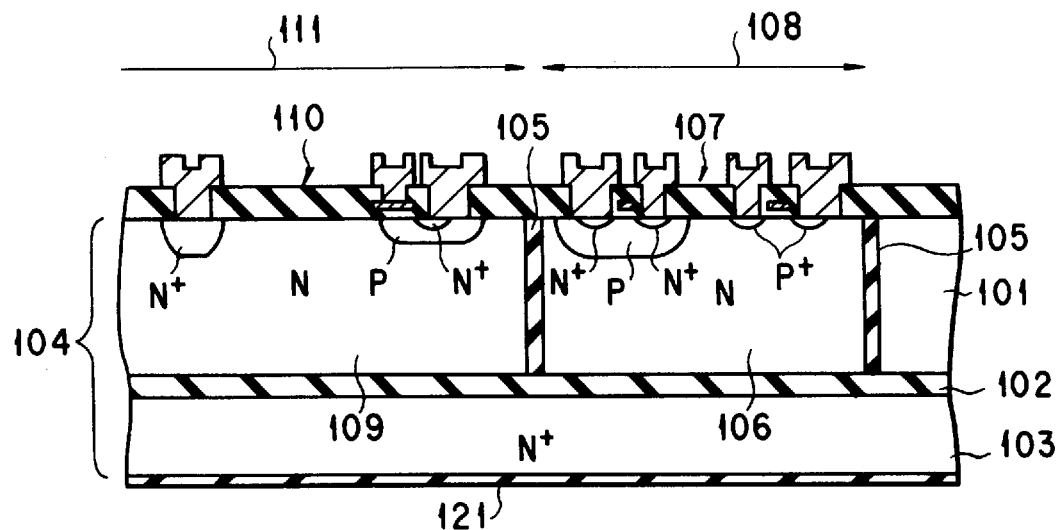
FIG. 1 is a cross-sectional view illustrating a prior art IPD in order to describe the problems thereof.

The vertical type power MOSFET 32 is formed in the power element section 31, so that the current density can be improved more greatly than in the conventional structure (see FIG. 1) which causes current to flow in the horizontal direction of the substrate, and the voltage of the device can easily be increased and so can be the current thereof.

A process of manufacturing the above bonded wafer 11 will now be described in brief with reference to FIGS. 3A to 3F.

Figure 3A:
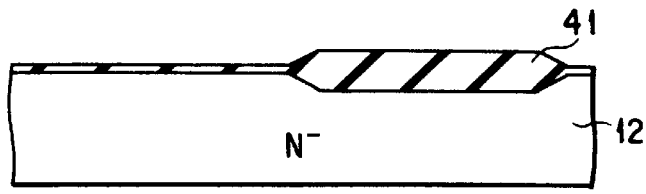
FIGS. 3A, 3B, 3C, 3D, 3E and 3F are cross-sectional views depicting the principal part of the IPD in order to explain a process of manufacturing a bonded substrate used in the IPD.
Figure 3B:
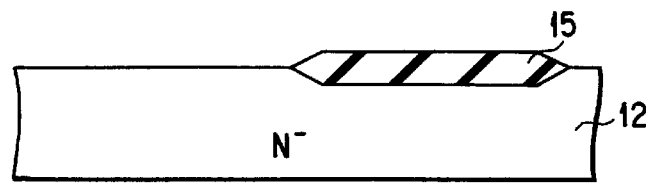

A partially thick oxide film 41 is grown on the non-element forming surface of the active-layer substrate 12 having a thickness of 620 µm by LOCOS (Local Oxidation of Silicon) (see FIG. 3A). The oxide film 41 on the field is selectively removed and only the oxide film 15 serving as a dielectric layer is left (see FIG. 3B).

Figure 3C:
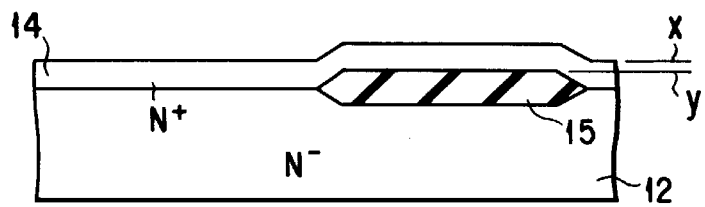

Silicon is epitaxially grown on the non-element forming surface of the active-layer substrate 12 on which the oxide film 15 is formed, thereby to form a silicon layer 14 (see FIG. 3C). The silicon layer 14 is so formed that its epitaxial surface (x) is higher than the upper surface (y) of the oxide film 15, that is, the oxide film 15 is completely buried into the silicon layer 14.

Figure 3D:
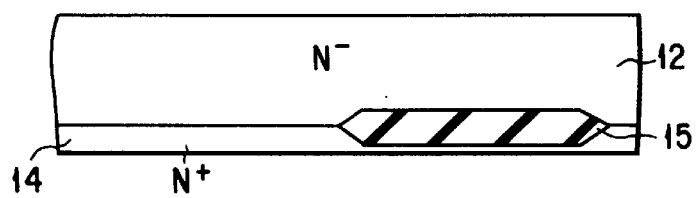
Figure 3E:
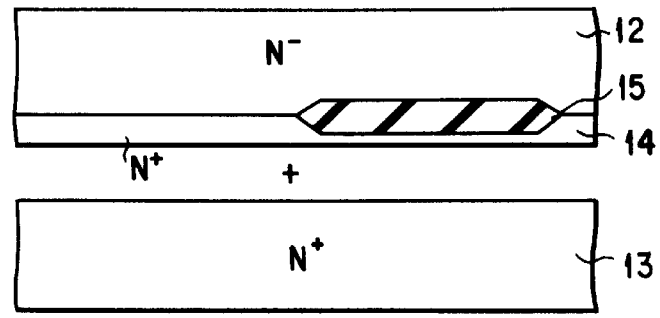

The epitaxial surface of the silicon layer 14 is mirror-finished by polishing or lapping (see FIG. 3D). The mirror-finished surface of the silicon layer 14 and that of the supporting substrate 13 are bonded together, with the result that the active-layer substrate 12 and supporting substrate 13 are bonded to each other with the silicon layer 14 interposed therebetween (see FIG. 3E).

Figure 3F:
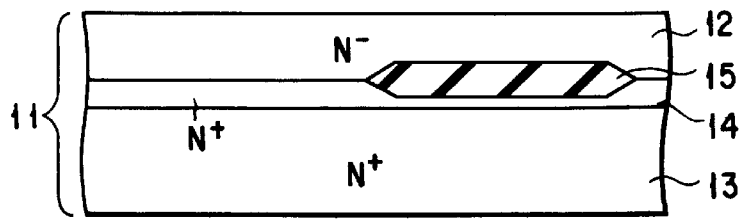

Finally, the element forming surface of the active-layer substrate 12 is polished to thickness of about 5 µm to complete the bonded wafer 11 (see FIG. 3F). When the need arises, the supporting substrate 13 is polished to a predetermined thickness.

As described above, when the IPD is manufactured, only the region for forming the IC controller can be isolated by a dielectric. The active-layer substrate having an oxide film on part of the interface thereof and the supporting substrate for supporting the active-layer substrate are bonded to each other with the eptaxially grown silicon layer interposed therebetween. Since, therefore, the IC controller of the IPD can effectively be isolated by a dielectric, the active-layer substrate can sufficiently be thinned. Consequently, a warp and crystal defects can be prevented from occurring, and a processing margin for forming an isolation trench can be improved.

In the first embodiment of the present invention, the vertical type power MOSFET, which causes current to flow in the vertical direction of the bonded substrate, is formed as a power element. The present invention is not limited to the Power MOSFET. For example, a power element section can be constituted by a power element having a trench structure (U-shaped structure).

Figure 4:
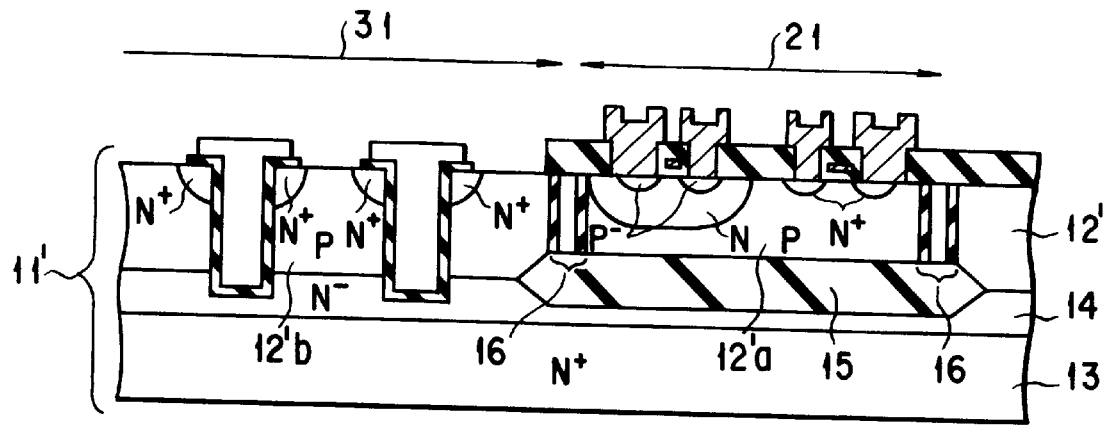
FIG. 4 is a cross-sectional view illustrating the principal part of an IPD according to a second embodiment of the present invention.

FIG. 4 illustrates an IPD according to a second embodiment of the present invention, which is manufactured by a MOS (U-MOS) having a trench structure.

A bonded wafer 11' used in the IPD of the second embodiment includes an active-layer substrate 12' of a P-type silicon wafer, a supporting substrate 13 of an N$^+$-type silicon wafer bonded to the active-layer substrate 12' with an N$^-$-type silicon layer (epitaxial layer) 14 interposed therebetween, and an oxide film (dielectric layer) 15 selectively formed in the interface between the active-layer substrate 12' and silicon layer 14.

Isolation trenches (isolation grooves) 16 are formed in the active-layer substrate 12' to such a depth as to reach the oxide film 15 from the element forming surface of the active-layer substrate 12'. An IC controller 21 constituted of at least one logic element (e.g., a CMOS circuit) is formed within a dielectric isolation region (first isolation region) 12'a completely surrounded with the isolation trenches 16 and oxide film 15.

On the other hand, a power element section 31 having at least one power element and controlled by the IC controller 21, is formed within an element region (second isolation region) 12'b joined to the silicon layer 14. In this case, a trench gate electrode is formed to such a depth as to reach the silicon layer 14 through a source layer provided on the element forming surface of the active-layer substrate 12' as the power element, and a MOS with the trench structure is obtained wherein the element region 12'b on the active-layer substrate 12' serves as a base layer and the silicon layer 14 and supporting substrate 13 each serve as a drain layer.

The power element having a trench structure is not limited to the U-MOS. For example, it can be formed by an IGBT (U-IGBT) having a trench structure.

Figure 5:
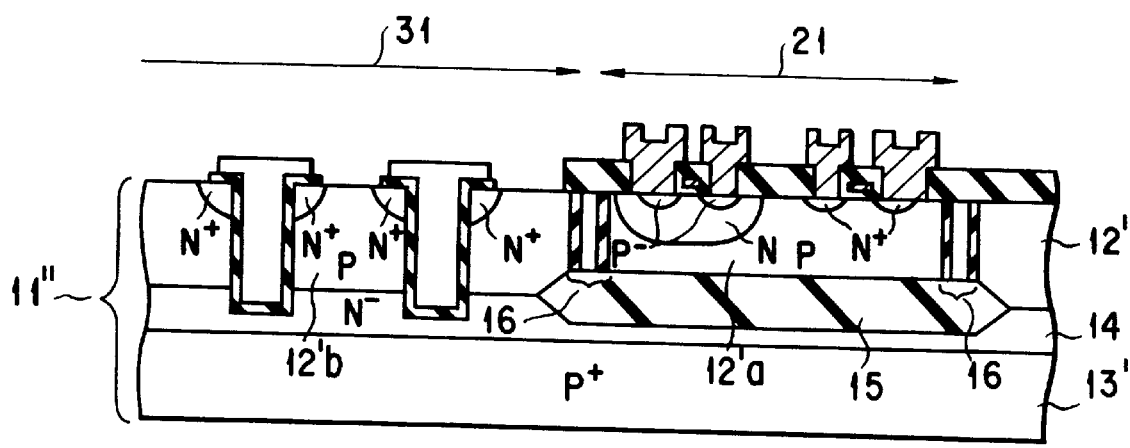
FIG. 5 is a cross-sectional view illustrating the principal part of the IPD according to a third embodiment of the present invention.

FIG. 5 illustrates an IPD according to a third embodiment of the present invention, which is formed by a U-IGBT.

A bonded wafer 11" used in the IPD of the third embodiment includes an active-layer substrate 12' of a P-type silicon wafer, a supporting substrate 13' of a P$^+$-type silicon wafer bonded to the active-layer substrate 12' with an N$^-$-type silicon layer (epitaxial layer) 14 interposed therebetween, and an oxide film (dielectric layer) 15 selectively formed in the interface between the active-layer substrate 12' and silicon layer 14.

Isolation trenches (isolation grooves) 16 are formed in the active-layer substrate 12' to such a depth as to reach the oxide film 15 from the element forming surface of the active-layer substrate 12'. An IC controller 21 constituted of at least one logic element (e.g., a CMOS circuit) is formed within a dielectric isolation region (first isolation region) 12'a completely surrounded with the isolation trench 16 and oxide film 15.

On the other hand, a power element section 31 having at least one power element and controlled by the IC controller 21, is formed within an element region (second isolation region) 12'b joined to the silicon layer 14. In this case, a trench gate electrode is formed to such a depth as to reach the silicon layer 14 through an emitter layer provided on the element forming surface of the active-layer substrate 12' as the power element, and an IGBT with the trench structure is obtained wherein the element region 12'b on the active-layer substrate 12' serves as a P-type base layer, the silicon layer 14 serves as an N$^-$-type base layer, and the supporting substrate 13' serves as a collector layer.

As described above, in the IPD having the power element section 31 formed by the power element with the trench structure, the element region 12'b on the active-layer substrate 12' is used as a base layer. Therefore, the active-layer substrate 12' can be thinned sufficiently and, as compared with the case where the base layer is formed by diffusion, the depth and channel length of the base layer can easily be controlled, and the channel can be shortened and the in-face variations in threshold values (Vth) can be suppressed.

It is needless to say that various changes and modifications can be made without departing from the scope of the subject matter of the present invention.

According to the foregoing present invention described in detail, there can be provided a semiconductor device and a semiconductor bonded substrate used for manufacturing the same in which the active-layer substrate can be made as thin as possible, a warp and crystal defects can be prevented from occurring, and a processing margin for forming an isolation trench can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method of manufacturing a semiconductor bonded substrate, comprising the steps of:

selectively forming a dielectric layer on one major surface of an active-layer substrate;

forming an epitaxial layer on the major surface of said active-layer substrate in thickness covering said dielectric layer;

mirror-finishing a surface of said epitaxial layer; and bonding a mirror-finished supporting substrate to the mirror-finished surface of said epitaxial layer.

* * * * *